United States Patent
Nakamura (10) Patent No.: US 6,697,259 B1
(45) Date of Patent: Feb. 24, 2004

(54) CIRCUIT BOARD OF PROTECTIVE CIRCUIT FOR STORAGE BATTERY, PROTECTIVE CIRCUIT FOR STORAGE BATTERY, AND STORAGE BATTERY PACK

(75) Inventor: Satoshi Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/646,915
(22) PCT Filed: May 13, 1999
(86) PCT No.: PCT/JP99/02483

§ 371 (c)(1),
(2), (4) Date: Oct. 11, 2000

(87) PCT Pub. No.: WO99/62309

PCT Pub. Date: Dec. 2, 1999

(30) Foreign Application Priority Data

May 28, 1998 (JP) ............................................ 10-147786

(51) Int. Cl.⁷ ................................................. H05K 5/04
(52) U.S. Cl. ........................ 361/752; 361/797; 361/803; 361/813; 361/686; 257/685; 257/686
(58) Field of Search ................................. 361/752, 770, 361/792, 797, 803, 813, 824, 508, 673, 686, 721, 760, 742, 720, 736; 257/686, 685

(56) References Cited

U.S. PATENT DOCUMENTS

| | | | |
|---|---|---|---|
| 3,270,251 A | * 8/1966 | Evans | 361/729 |
| 4,991,228 A | * 2/1991 | Ohta et al. | 455/300 |
| 5,452,182 A | * 9/1995 | Eichelberger et al. | 361/749 |
| 5,717,556 A | * 2/1998 | Yanagida | 174/254 |
| 5,892,304 A | * 4/1999 | McLellan et al. | 257/678 |
| 5,929,600 A | * 7/1999 | Hasegawa | 320/112 |

FOREIGN PATENT DOCUMENTS

| | | |
|---|---|---|
| JP | 57-22264 | 2/1982 |
| JP | 59-4874 | 2/1984 |
| JP | 05013173 A | 1/1993 |
| JP | 08329913 A | 12/1996 |
| JP | 09171804 A | 6/1997 |
| JP | 09289002 A | 11/1997 |

OTHER PUBLICATIONS

Abstract of Japanese Patent Publication No. 08329913; dated Dec. 13, 1996.
Abstract of Japanese Patent Publication No. 10144270; dated May 29, 1998.

\* cited by examiner

Primary Examiner—Randy Gibson
Assistant Examiner—Hung Bui
(74) Attorney, Agent, or Firm—Arent Fox Kintner Plotkin & Kahn, PLLC (57) ABSTRACT

A protective circuit device (3) according to the present invention prevents overcharge to a storage battery (2). Protective circuit device (3) has a circuit board body (32) with a prescribed circuit pattern, and island portions (33, 34) having on their surfaces a plurality of external terminals (30) and connected to circuit board body (32) through a metal piece (35, 36). Island portions (33, 34) preferably includes first and second islands. First island (33) preferably has an external terminal (30) and is parallel to circuit board body (32). Second island (34) is preferably arranged between first island (33) and circuit board body (32) and is vertical to circuit board body (32).

6 Claims, 9 Drawing Sheets

CIRCUIT BOARD OF PROTECTIVE CIRCUIT FOR STORAGE BATTERY, PROTECTIVE CIRCUIT FOR STORAGE BATTERY, AND STORAGE BATTERY PACK

TECHNICAL FIELD

The present invention relates to a protective circuit device for a storage battery for preventing overcharge to the storage battery, circuit board device of the protective circuit, and storage battery pack provided with the protective circuit device.

BACKGROUND ART

In electronic devices such as portable telephones, a storage battery pack with a storage battery enclosed in a resin casing is generally used as a power supply source. In most cases, a protective circuit device for preventing overcharge to the storage battery is included in the storage battery pack. The protective circuit device has a charging terminal for charging the storage battery with electricity from a domestic plug socket or the like, and a discharging terminal for supplying electricity to a terminal device such as a portable telephone. An exemplary conventional protective circuit device is shown in FIGS. 12 and 13.

Figure 12:
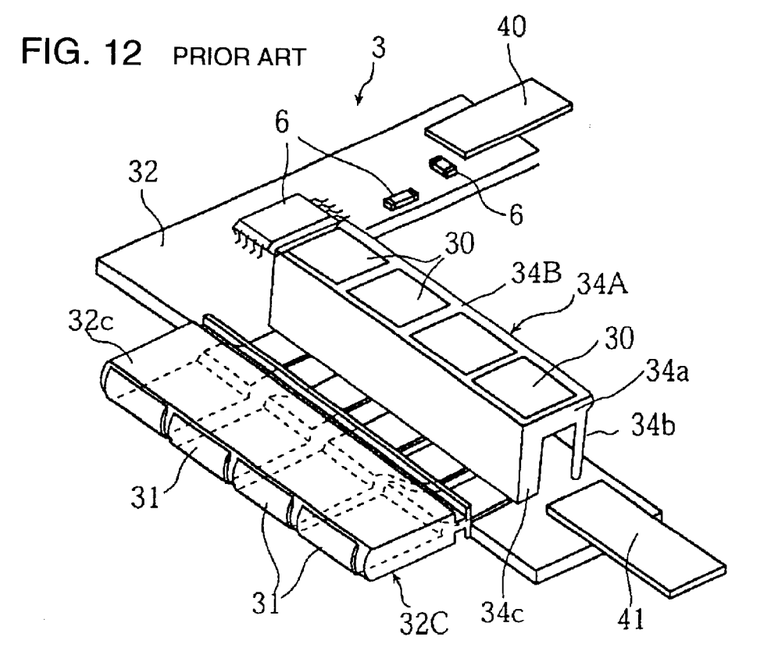
FIG. 12 is a perspective view showing an exemplary conventional protective circuit device.
Figure 13:
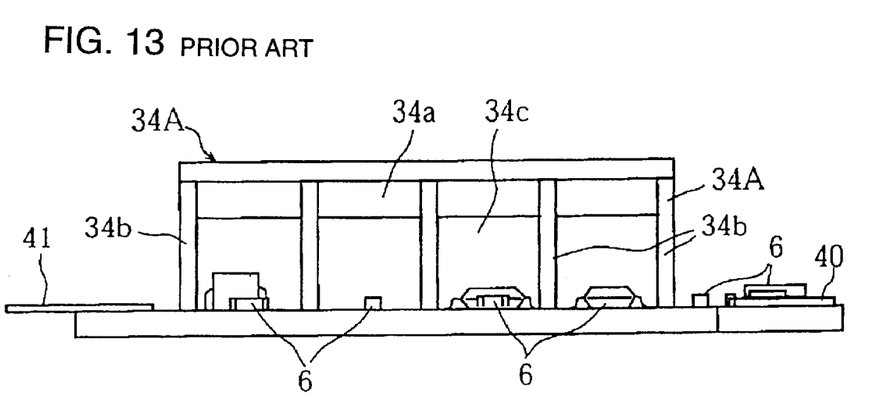
FIG. 13 is a back view showing a conventional protective circuit device.

A protective circuit device 3 shown in FIGS. 12 and 13 has a prescribed interconnection pattern (not shown) and a circuit board 32 on which various electronic parts 6, including a chip resistor, are mounted. Circuit board 32 is in an L shape, and has metal terminals 40 and 41 at both ends. In addition, a first terminal portion 32C and a second terminal portion 34A, in which a plurality of metal pieces are inserted into resin, are mounted to protective circuit device 3. Terminal portions 32C and 34A are electrically connected to metal terminals 40 and 41.

First terminal portion 32C has a structure in which the region of the metal piece is partially exposed from the surface of a resin portion 32c. First terminal portion 32C is mounted to circuit board 32 such that the exposed region is on the side of the back surface of circuit board 32 (faces down). The exposed region turns to, for example, charging terminal 31. On the other hand, second terminal portion 34A has a structure in which each metal piece is partially exposed from the upper surface of a so-called terminal base 34B (a resin portion) having a prescribed height. The region in which the metal piece is exposed turns to, for example, discharging terminal 30.

Terminal base 34B has a horizontal portion 34a in which the metal terminal is exposed, as well as a vertical wall 34c and a plurality of leg portions 34b that are downwardly extending from horizontal portion 34a. Namely, with second terminal portion 34A mounted to circuit board 32, a prescribed space is formed between circuit board 32 and the lower surface of horizontal portion 34a, as shown in FIG. 13. Thus, various electronic parts 6 can be mounted in the region of circuit board 32 directly below horizontal portion 34a before mounting second terminal portion 34A. After mounting electronic parts 6, second terminal portion 34A is mounted to circuit board 32 such that contact between second terminal portion 34A and electronic parts 6 is avoided.

However, the above described protective circuit device 3 suffers from problems related to a low efficiency in manufacture and cost involved. The reason is as follows. Since first and second terminal portions 32C and 34A are formed by inserting metal pieces into resin, steps of forming terminal portions 32C and 34A are additionally required. Further, in the steps of forming terminal portions 32C and 34A, molds for forming resin portions 32c and 34B of terminal portions 32C and 34A and for inserting the metal pieces are required. The molds are required for each of terminal portions 32C and 34A.

Moreover, manufactured protective circuit device 3 should be tested to determine as to if it operates as designed. Then, if protective circuit device 3 is determined to be defective due to a mounting failure of electronic part 6 mounted in a region of circuit board 3 corresponding to second terminal portion 34A, such poorly mounted electronic part 6 cannot be re-mounted unless second terminal portion 34A is removed. Thus, if electronic part 6 is not properly mounted in the region of circuit board 32 corresponding to second terminal portion 34A, protective circuit device 3 must be discarded, whereby the yield is decreased.

DISCLOSURE OF THE INVENTION

The present invention is made to solve the aforementioned problems. An object of the present invention is to manufacture a protective circuit device and storage battery pack with high efficiency and favorable cost.

A circuit board of a protective circuit for a storage battery according to the present invention has a first board including a circuit portion, and a second board connected to the first board through a deformable conductive member. The circuit portion includes, for example, an interconnection pattern and an electronic part connected thereto. The conductive material may be a metal piece, for example.

The first board preferably has a first external terminal electrically connected to the circuit portion. The second board preferably has a second external terminal electrically connected to the circuit portion.

Further, the first board preferably has a protrusion protruding from one end thereof. In this case, the first external terminal is formed on the protrusion. The second board is preferably arranged on the side opposite to the protrusion with respect to and spaced from the first board.

A third board may be provided between the first and second boards. In this case, the first, second, and third boards may be connected by the same conductive member. The conductive member may include the first and second conductive members. Then, the first conductive member connects the first and third boards, whereas the second conductive member connects the second and third boards.

Further, the first and second boards may be formed in the region surrounded by a frame. A plurality of such regions are provided, each having the first and second boards.

Normally, various electronic parts and the like are mounted on the board with a plurality of boards collectively connected by the frame. After terminals to be electrically connected to the mounted electronic parts are formed, each board is separated from the frame. Thus, a circuit for an intended use is obtained. Here, as the second board (island) is connected to the first board (the circuit board body) through the conductive member, the second and the first boards are maintained in a desired positional relationship with the conductive member bent. For example, the second board can be vertical or parallel to the first board. In addition, if the circuit board of the protective circuit has a third board (island), for example, the second board can be parallel to the first board and the third board can be vertical to the first board thereby connecting the first and second boards.

Since the second board is connected to the first board through the conductive member, the second and first boards can be electrically connected. In this case, the second board may be provided with electronic parts and terminals. If the protective circuit board is provided with a third board, the second board can be parallel to the first board by separating the board from the frame and bending the conductive member. Thus, if the external terminal is formed on the second board, for example, the above mentioned second and third boards serve as the second terminal portion of the conventional example.

If the second board is parallel to the first board and the second board is arranged directly above the first board, a prescribed space is obtained between the first and second boards. The height of the space can be determined by appropriately selecting the dimension of the third board, length of the conductive member and the like. Various electronic parts are mounted to the first board before bending the conductive member, for example in the state of collective board. In this case, by appropriately setting the height of the space, contact between the second board and the electronic parts can be avoided even if the second board is arranged directly above the first board after the electronic parts are mounted. In addition, at least the thickness of the storage battery ensures the thickness of the protective circuit device (a distance between the second and first boards). Accordingly, the electronic parts can also be mounted on opposing surfaces of the first and second boards, whereby the mounting area of the electronic parts can be increased.

The circuit board of each protective circuit can be tested as to if it operates as intended in the state of the collective board with the protective circuit board supported by the frame. Since the test is performed with the second terminal portion formed, if the electronic parts are not properly mounted below the horizontal portion of the second terminal portion, it is difficult to re-mount the electronic parts. On the other hand, in the present invention, test is performed with the first and second boards being flush with each other in the state of the collective board, i.e., with the electronic parts being mounted. Thus, if the test reveals that the electronic part is poorly mounted, such an electronic part can easily be re-mounted, so that the yield increases. Further, as the first and second external terminals are respectively formed on the first and second boards in the state of collective board, an amount of displacement in position between the external terminals after the manufacture of the protective circuit device can be reduced as compared with the conventional example where the external terminal portion is separately mounted to the board.

A protective circuit device for a storage battery according to the present invention includes a first board having a circuit portion, and a board connected to the first board through a conductive member.

The first board preferably has a first external terminal electrically connected to the circuit portion, and the second board preferably has a second external terminal electrically connected to the circuit portion.

The conductive member is preferably bent, and the second board is arranged opposite to and spaced from the first board.

The first board may have a protrusion. In this case, the first external terminal is formed on the protrusion. The second board is connected to the end of the first board positioned on the side opposite to the protrusion.

Electronic parts electrically connected to the circuit portion may be mounted on the surface of the second board that is opposite to the first board.

Further, a third board may be provided between the second and first boards. In this case, the third board may be vertical to the first board and may have an interconnection pattern electrically connected to the circuit portion on the surface of the third board.

An electronic part without a coating for increasing moisture resistance may be mounted on the second board, and that with such a coating may be mounted on the first board.

According to the protective circuit device for a storage battery of the present invention, the second board can be vertical to or parallel to the first board by bending the conductive member. Thus, the protective circuit device can be conveniently incorporated in the storage battery pack.

Some protective circuit devices are coated with epoxy or acrylic based resin, and the like. Although the coating operation is performed on a specific electronic part, in this case, the electronic parts not to be coated should be masked with a polyimide tape or the like. In the protective circuit device of the present invention, the first and second boards are connected through the conductive member, but the mounting surfaces of the electronic parts of the boards are separated. Thus, the electronic parts without coatings are concentrated on the second board, and those with coatings are concentrated on the first board, so that the coating operation can be intensively performed on the first board. As a result, the electronic parts not to be coated, i.e., those mounted to the second board, needs not be masked. Thus, in the protective circuit of the present invention, an operation of coating the electronic parts with resin is not only facilitated, but a masking operation for coating can advantageously be eliminated.

In addition, when the third board is provided, the second board is parallel to the first board, and the third board is vertically connected to the first and second boards, a terminal base of the conventional protective circuit device can be formed by the second and third board. Here, formation of the external terminal on the second board enables formation of a portion corresponding to the conventional second terminal portion by the second and third board as well as the external terminal. Thus, the second terminal portion needs not be separately formed by insertion, so that manufacturing efficiency of the protective circuit device is increased and cost is reduced.

A protective circuit device according to the present invention can be obtained by directly forming the external terminal on the protective circuit board in the state of collective board, for example, and by bending the conductive member after separating the protective circuit board from the collective board. A series of the above described operations enables formation of the portion corresponding to the second terminal portion of the conventional protective circuit device. Accordingly, there is no need to mount the second terminal portion to the first board. In addition, since the portion corresponding to the second terminal portion needs not be formed by resin molding, there is no need to prepare a mold. Thus, cost involved is extremely favorable.

In addition, a plurality of external terminals to be electrically connected to the interconnection pattern can be directly formed. Namely, the portion corresponding to the first terminal portion of the conventional protective circuit device can directly be formed in the first board. In this case also, manufacturing efficiency of the protective circuit device is increased and cost is reduced. Although the first terminal portion is also formed by insertion as in the case of the second terminal portion, which is in turn mounted to the protective circuit board such an operation is not necessary in the convention protective circuit device.

It is noted that each external terminal portion may be formed by mounting a terminal such as metal, or by coating a terminal pad, which is formed simultaneously with the interconnection pattern, with metal.

A storage battery pack of the present invention includes a storage battery, a protective circuit device electrically connected to the storage battery to prevent overcharge to the storage battery, and an insulation casing enclosing the storage battery and the protective circuit device. The protective circuit device includes a first board having a circuit portion, and a second board connected to the first board through a conductive member.

The conductive member is preferably bent. At the time, the second board is preferably arranged in a position opposite to and spaced from the first board. The second board has a second external terminal electrically connected to the circuit portion. The first board preferably has a first external terminal electrically connected to the circuit portion. The first and second external terminals are exposed from the surface of the insulation casing.

A storage battery may be inserted between the second and first boards.

The storage battery pack of the present invention is provided with the above described protective circuit device, so that aforementioned various effects are produced. Therefore, the storage battery pack of high performance can be provided with low cost.

BEST MODES FOR CARRYING OUT THE INVENTION

Now, preferred embodiments of the present invention will be described in detail with reference to the drawings.

Figure 1:
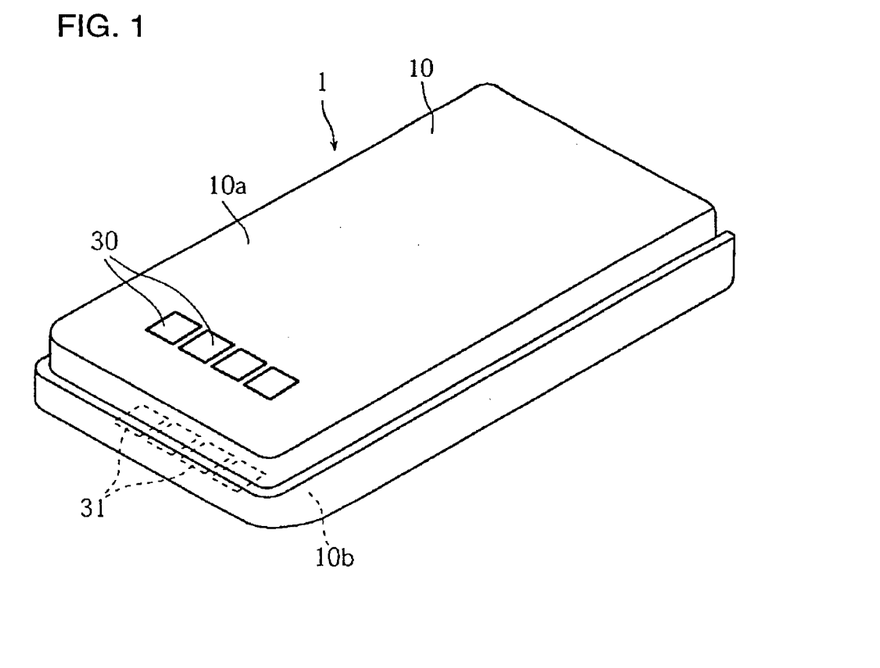
FIG. 1 is a perspective view showing an exemplary storage battery pack according to the present invention.
Figure 2:
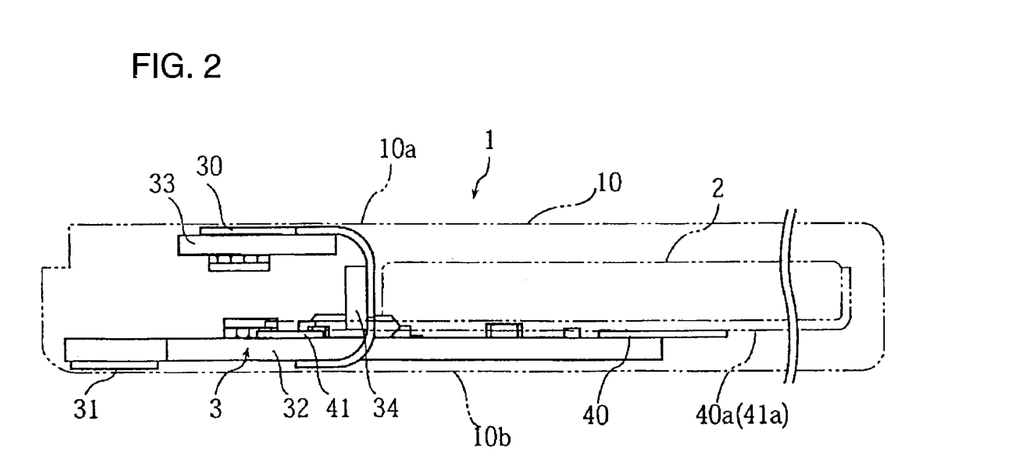
FIG. 2 is a side view showing a protective circuit device incorporated in the storage battery pack shown in FIG. 1.
Figure 3:
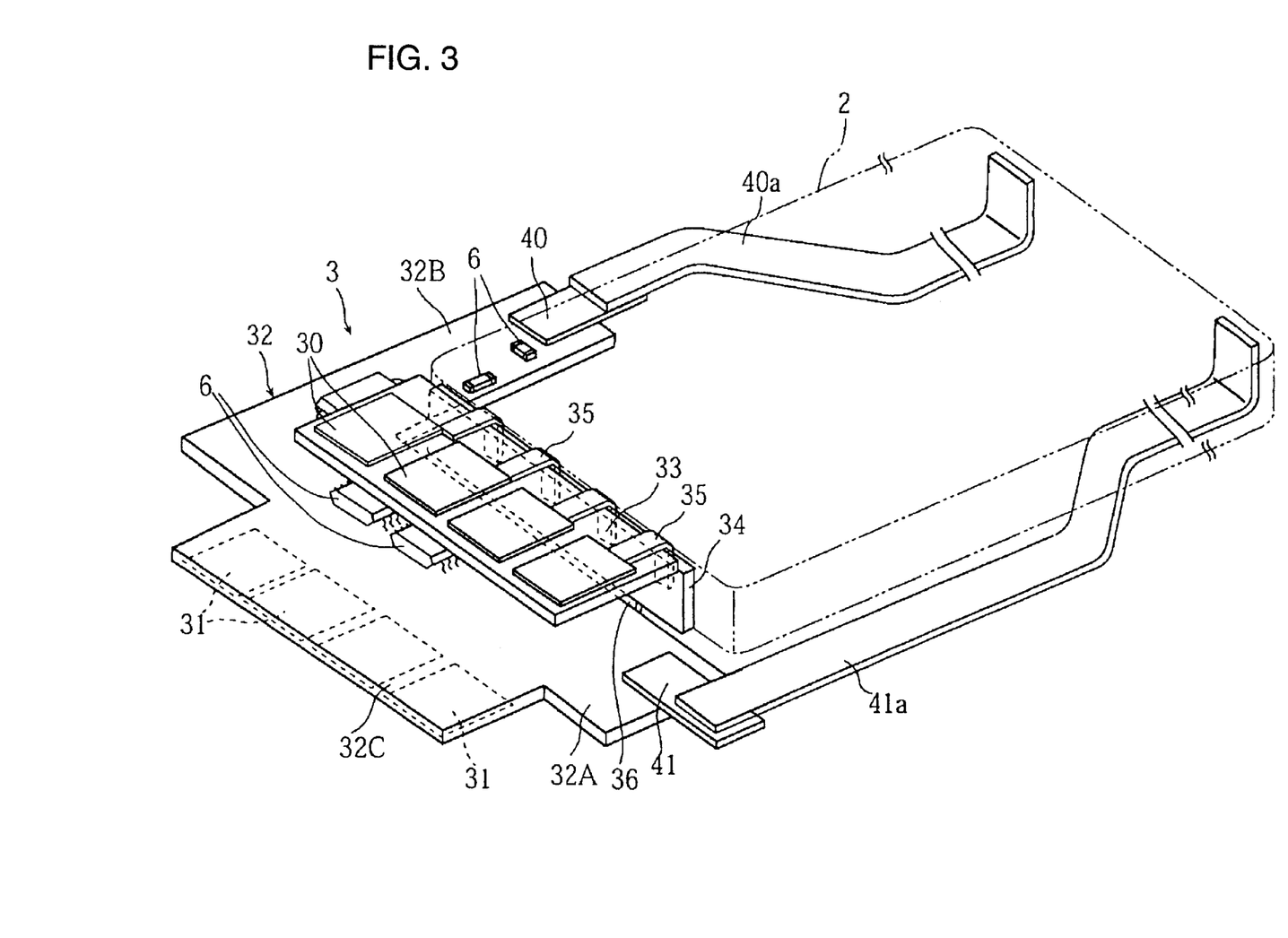
FIG. 3 is a perspective view showing the protective circuit device.
Figure 4:
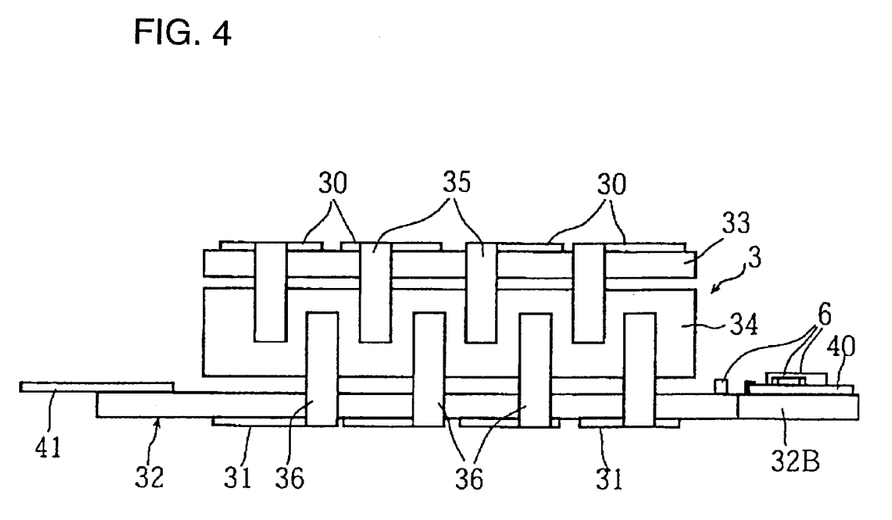
FIG. 4 is a back view showing the protective circuit device.

FIG. 1 is a perspective view showing an exemplary storage battery pack according to the present invention. FIG. 2 is a perspective side view showing a protective circuit device according to the present invention which is incorporated in the storage battery pack. FIG. 3 is a perspective view of the protective circuit device. FIG. 4 is a back view of the protective circuit device. It is noted that, the same members, elements and the like shown in the drawings are denoted by the same reference numerals as in the conventional example. In addition, in the present embodiment, the storage battery pack used as a power supply source for a portable telephone is described.

As shown in FIGS. 1 and 2, a storage battery pack 1 has a structure in which a storage battery 2 and protective circuit device 3 are enclosed in a resin casing 10, which is generally rectangular in shape when viewed from above and has a prescribed thickness. Four discharging terminals 30 for supplying electricity from storage battery 2 to a portable telephone body (not shown) are formed on one surface 10a of storage battery pack 1. Four charging terminals 31 for charging storage battery 2 with electricity from the external power supply source (not shown) are exposed on the other surface 10b of storage battery pack 1.

Discharging terminal 30 and charging terminal 31 are formed on protective circuit device 3. Protective circuit device 3 has a circuit board body (first board) 32, first island (second board) 33, and second island (third board) 34, as shown in FIGS. 2 and 4. The material and thickness of these portions are substantially the same.

As shown in FIG. 3, circuit board body 32 is in an L shape, where a narrow portion 32B extends from one side of a wide portion 32A in a width direction at the end of the wide portion 32A. In addition, circuit board body 32 has an extending portion (protrusion) 32C outwardly extending from one side of wide portion 32A from the middle portion thereof. Circuit board body 32 in such a configuration is provided, on its front and back surfaces, with prescribed patterns (not shown) forming a part of the circuit portion. Various electronic parts 6 such as a chip resistor are mounted to the front surface (in some cases also to the back surface) of circuit board body 32 to be electrically connected to the interconnection patterns and to form the part of the circuit portion. Metal terminals 40 and 41 such as nickel plates are mounted to both ends of circuit board body 32 (leading ends of wide portion 32A and narrow portion 32B). Terminals 40a, 41a for extension are connected to metal terminals 40 and 41, which are in contact with the electrode of storage battery 2.

Four first external terminals 31 are formed on the back surface of protrusion 32C to be electrically connected to the interconnection patterns. Namely, a portion corresponding to the first terminal portion of the conventional protective circuit device is formed by protrusion 32C and each of the first external terminals 31. It is noted that these first external terminals 31 are formed by mounting the terminals such as metal by means of soldering or by coating the terminal pad with metal which is formed simultaneously with the interconnection patterns. When protective circuit device 3 is included in a prescribed casing to form storage battery pack 1, each of first external terminals 31 turns to charging terminal 31 for supplying storage battery 2 with electricity from the external power supply source (not shown).

As shown in FIG. 3, first island 33 is rectangular in shape and arranged parallel to and above wide portion 32A. First island 33 is connected to circuit board body 32 through second island 34 which is vertically arranged between first island 33 and circuit board body 32. More specifically, as shown in FIGS. 2 and 4, first island 33 and second island 34 are connected by four first metal pieces (conductive members) 35, each bent at a right angle. Second island 34 and circuit board body 32 are connected by four second metal pieces (conductive members) 36, each bent at an right angle. As in the case of first external terminals 31, these second external terminals 30 are formed by mounting terminals such as metal or by coating the external pad which is formed simultaneously with the interconnection pattern with metal.

Each of first metal piece 35 is electrically connected to corresponding second external terminal 30 and, for example, is electrically connected to corresponding second metal piece 36 by an interconnection formed on second island 34. These second metal pieces 36 are electrically connected to the interconnection pattern formed on circuit board body 32, so that each second external terminal 30 is electrically connected to the interconnection pattern. The back surface of first island 33 may be provided with a prescribed interconnection pattern and electronic parts 6. It is noted that, when protective circuit device 3 is enclosed in a prescribed casing to form storage battery pack 1, each of second external terminals 30 turns to discharging terminal 30 for supplying the portable telephone body (not shown) with electricity.

In protective circuit device 3 having the above described structure, second external terminal 30 is formed on first island 33 which is arranged parallel with circuit board body 32 at a prescribed height. Thus, first island 33, second island 34, and second external terminal 30 form a portion corresponding to the second terminal portion of the conventional protective device.

Next, a manufacturing method of protective circuit device 3 will briefly be described. For the sake of convenience, first, description of a collective board 7 used in manufacturing protective circuit device 3 will be given with reference to FIG. 5. It is noted that, in the present embodiment, first and second external terminals 30, 31 are formed by mounting metal terminals.

Figure 5:
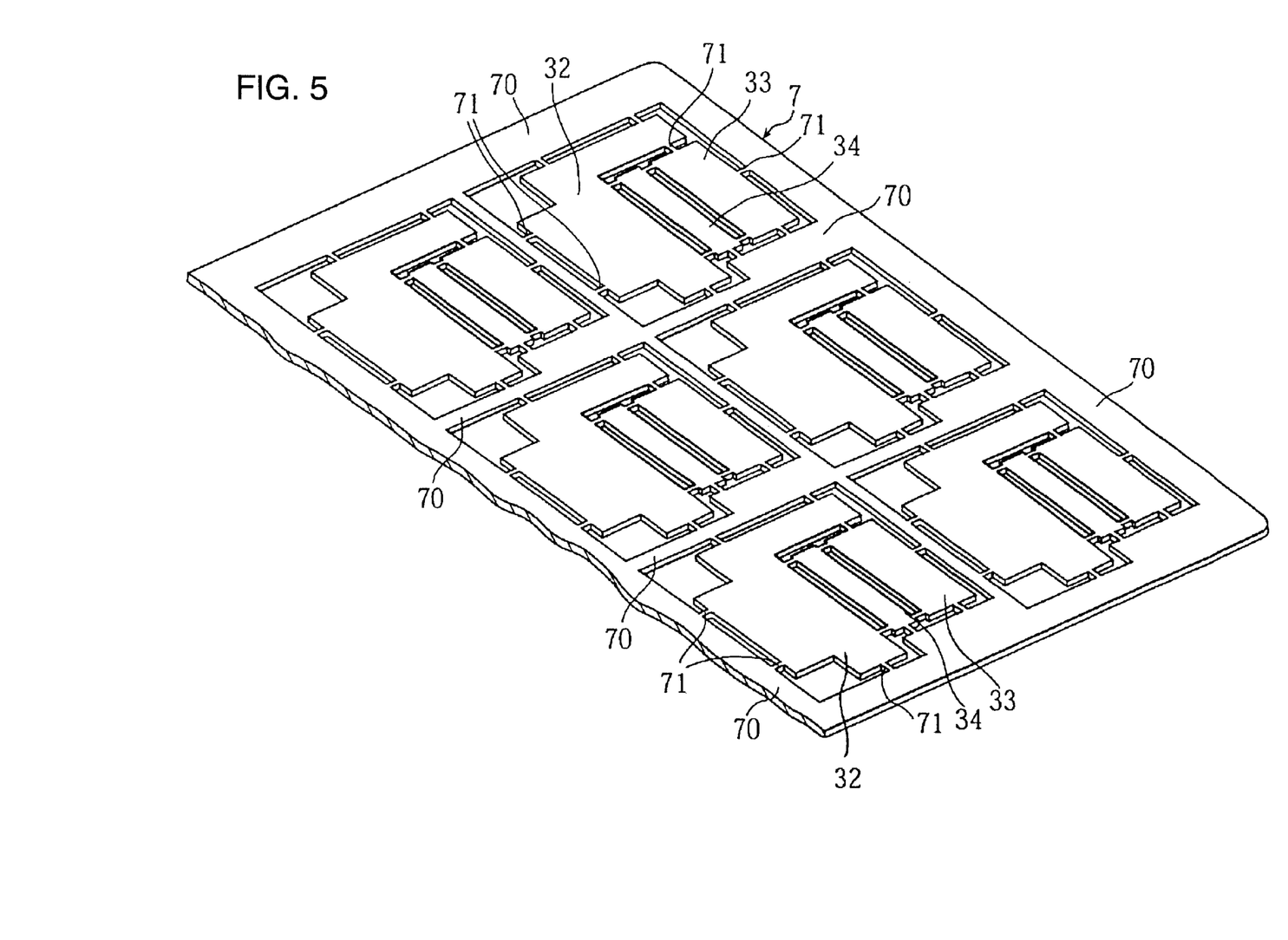
FIG. 5 is a perspective view showing a collective board used for manufacturing the protective circuit device.

As shown in FIG. 5, collective board 7 has a plurality of rectangular regions surrounded by frame 70. Each of the rectangular regions has a unit circuit board (corresponding to circuit board body 32, first island 33, and second island 34). In collective board 7, circuit board body 32, first island 33, and second island 34 of protective circuit device 3 are separated when viewed from above. Circuit board body 32 is supported by frame 70 through bridges 71. Circuit board body 32 is also connected to second island 34 through bridges 71. First island 33 is also supported by frame 70 through bridges 71. First island 33 is also connected to second island 34 through bridges 71.

Figure 6:
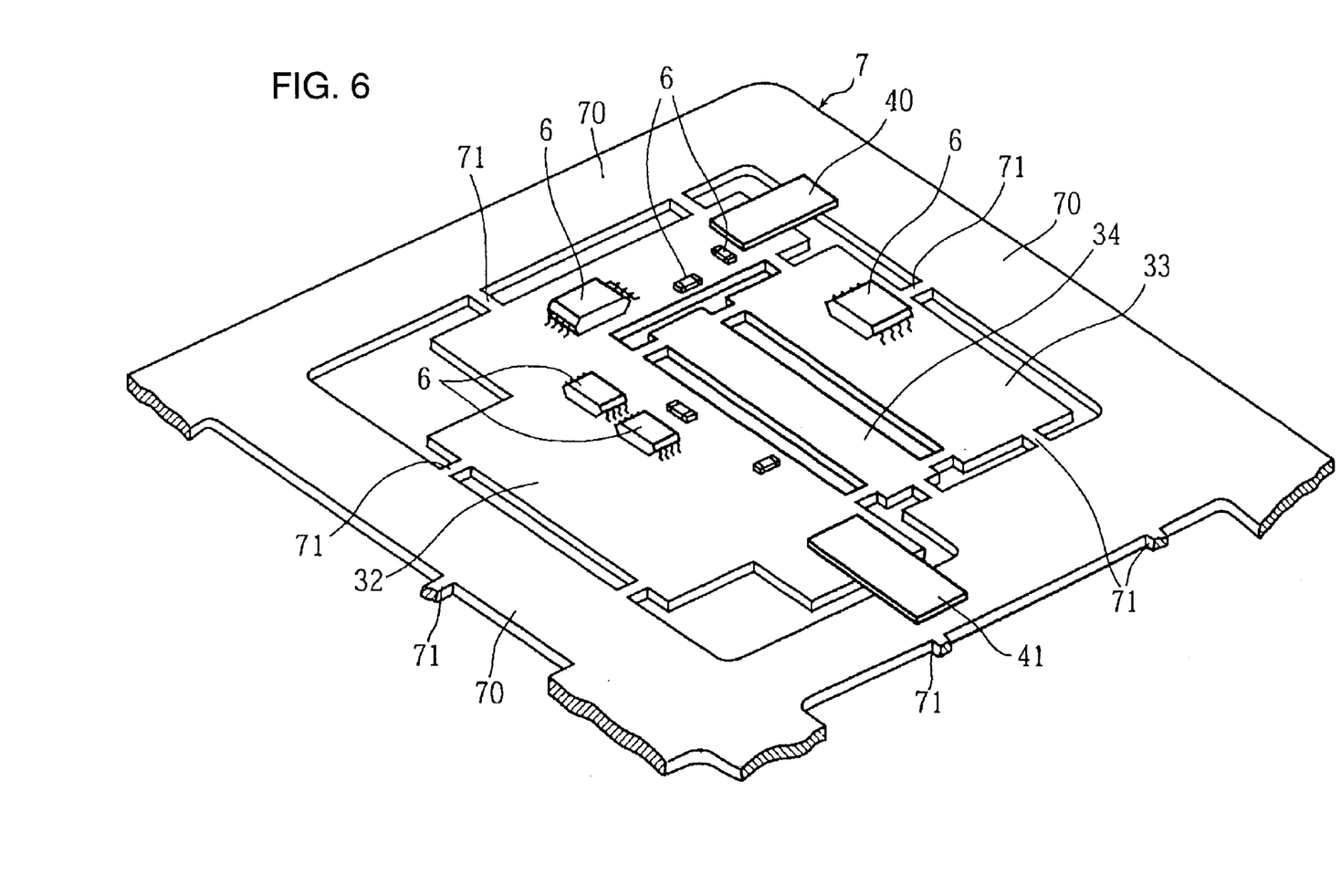
FIG. 6 is a perspective view showing a unit circuit board (protective circuit) on which various electronic parts are mounted in the first mounting step.

Various electronic parts and metal pieces must be mounted onto both surfaces of collective board 7, so that the mounting operation must be performed twice. In this case, the first mounting operation is performed as follows. Namely, various electronic parts 6 and metal pieces are automatically aligned and positioned using a mounter or the like, corresponding to prescribed terminal pads formed on circuit board body 32. Thus, the structure as shown in FIG. 6 is obtained. A solder paste is preliminary applied to the terminal pad or the terminal of the part to be mounted. The solder paste is re-melted in a furnace for reflowing, and cooled down to solidify. Thus, electronic parts 6 and the like are mounted.

Figure 7:
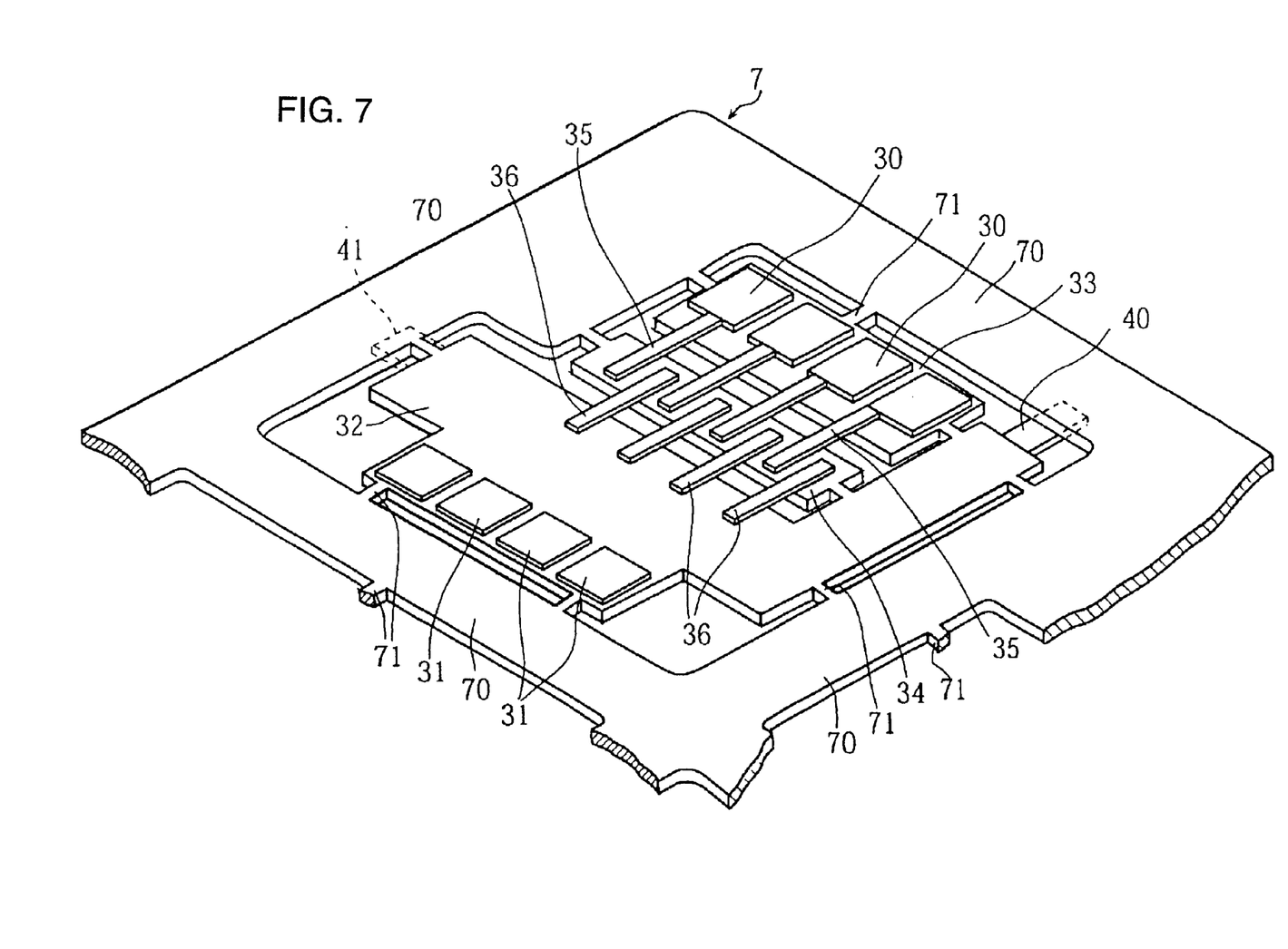
FIG. 7 is a perspective view showing a unit circuit board (protective circuit) on which various electronic parts are mounted in the second mounting step.

Then, the second mounting operation is performed. The operation is performed with the front and back surfaces of collective board 7 reversed. More specifically, each of first metal pieces 35 is placed over first island 33 and second island 34 to connect them, and each of second metal pieces 36 is placed over second island 34 and circuit board body 32 to connect them. This results in the structure shown in FIG. 7. In the present embodiment, since external terminals 30 and 31 are formed by metal terminals, metal terminals are arranged on first island 33 and protrusion 32 of circuit board body 32. A solder paste is preliminary applied to each of metal pieces 35 and 36 and metal terminals or the terminal pad provided with the terminal pieces. The solder paste is re-melted in the reflow furnace, and then cooled down to solidify. Thus, each of metal pieces 35 and 36, metal terminals and the like are mounted.

A given circuit such as protective circuit device 3 is in some cases coated for example with epoxy or acrylic based resin for preventing leakage. The coating operation is performed on a specific electronic part 6. During the coating operation, electronic part 6 that is not to be coated is masked by a polyimide tape or the like. Although circuit board body 32 and first island 33 are connected through metal pieces 35, 36 in collective board 7, mounting surfaces of electronic parts 6 of circuit board body 32 and first island portion 33 are separated when viewed from above. Thus, electronic parts 6 which are not to be coated are concentrated for example on first island 33 and those to be coated are concentrated on circuit board body 32, so that an intensive coating operation on circuit board body 32 is facilitated. In addition, a masking operation on electronic part 6 which is not to be coated, i.e., electronic part 6 mounted on first island 33, can be eliminated. Thus, when protective circuit device 3 is manufactured using collective board 7, a masking step for coating electronic part 6 with resin can advantageously be eliminated.

Each unit circuit board provided with electronic part 6 or the like as described above substantially operates in the same way as protective circuit device 3, so that each unit circuit board (circuit) is tested to determine as to if it operates as intended in the state of collective board 7. In the conventional example, the test is performed with the second terminal portion formed. Thus, if electronic part 6 below the horizontal portion of the second terminal portion is poorly mounted, it is difficult to re-mount the electronic part. On the other hand, in the present invention, test is performed in the state of collective board 7, i.e., the state in which electronic part 6 is mounted. Accordingly, even if it is determined that electronic part 6 and the like are poorly mounted, such electronic parts can be re-mounted, so as to increase the yield.

Figure 8:
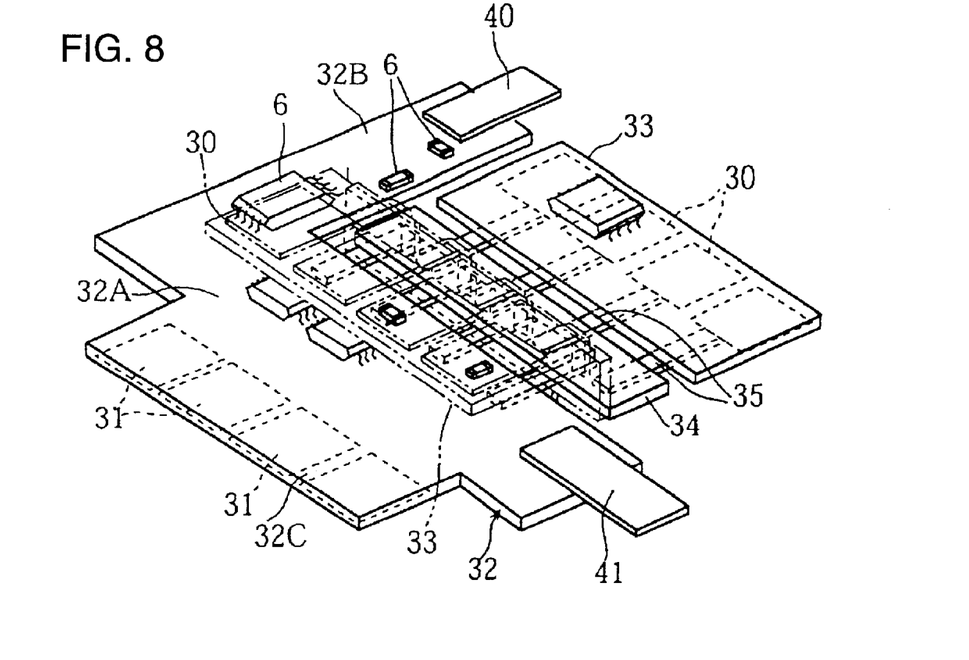
FIG. 8 is a perspective view showing the unit circuit board separated from the collective board.

Then, by cutting bridges 71, protective circuit device 3 shown in FIG. 8 is obtained. In protective circuit device 3 in this state, first island 33 and second island 34 are separated from circuit board body 32. More specifically, first and second islands 33 and 34 are spaced apart from circuit board body 32 in a horizontal direction. First and second metal pieces 35, 36 of protective circuit device 3 in this state are bent as shown by an imaginary line in FIG. 8. Thus, protective circuit device 3 shown in FIG. 2 or FIG. 4 is obtained.

As described above, a series of operations of mounting various electronic parts 6 and the like in the state of collective board 7 and bending metal pieces 35, 36 provides portions corresponding the first and second terminal portions of the conventional protective circuit device. Thus, there is no need to form the first and second terminal portions by insertion molding and to mount them to circuit board body 32. Particularly, molds need not be prepared since resin is not necessary, so that cost is favorably reduced. Further, the alignment accuracy of the first and second external terminals can be increased as compared with the conventional example.

Moreover, if metal pieces 35, 36 are bent, first island 33 is arranged parallel to circuit board body 32, and first island 33 is arranged directly above circuit board body 32, a prescribed space is formed between circuit board body 32 and first island 33 as shown in FIGS. 2 and 3. The height of the space can be suitably determined for example by a dimension of second island 34, length of each of metal pieces 35, 36, and the like. Various electronic parts 6 are mounted to circuit board body in the state of collective board 7 before bending metal pieces 35 and 36. In this case, as long as the height of the space is properly set, even if metal pieces 35, 36 are bent and first island 33 is arranged directly above circuit board body 32 after mounting electronic part 6, contact between first island 33 and electronic part 6 is avoided. In addition, if circuit board body 32 is used as protective circuit device 3 for a storage battery, the thickness of protective circuit device 3 (a distance between first island 33 and circuit board body 32) can be at least the thickness of the storage battery. Accordingly, electronic parts 6 can be mounted on opposing surfaces of circuit board body 32 and first island 33, so that the mounting area of electronic parts 6 can be increased.

Figure 9:
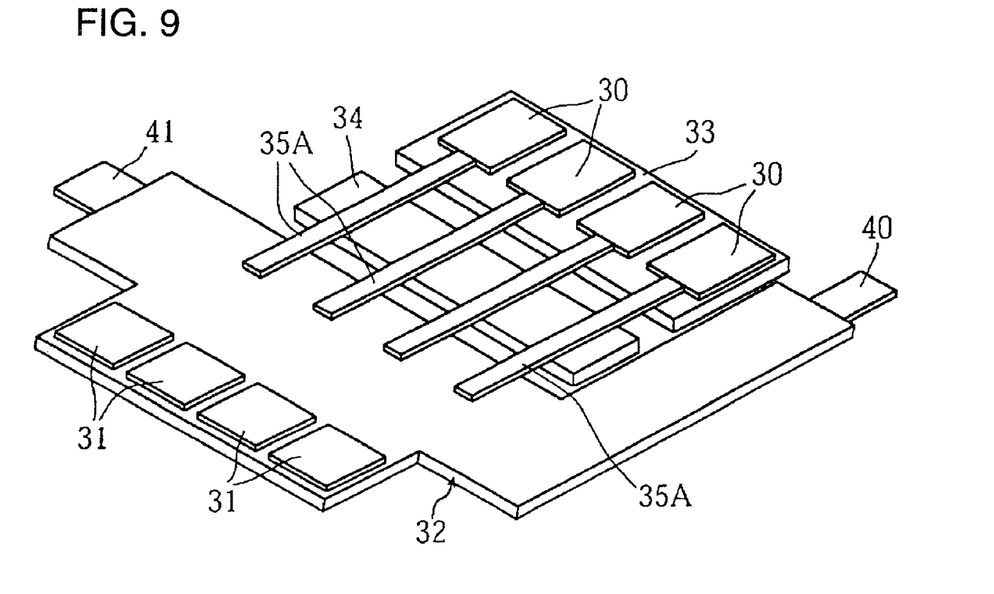
FIG. 9 is a perspective view showing a modification of the protective circuit device.

It is noted that, in the above described embodiment, first island 33 and second island 34 are connected by first metal piece 35, and second island 34 and circuit board body 32 are connected by second metal piece 36. However, as shown in FIG. 9, first island 33, second island 34, and circuit board body 32 may be connected by one kind of metal piece 35A as shown in FIG. 9.

Figure 10:
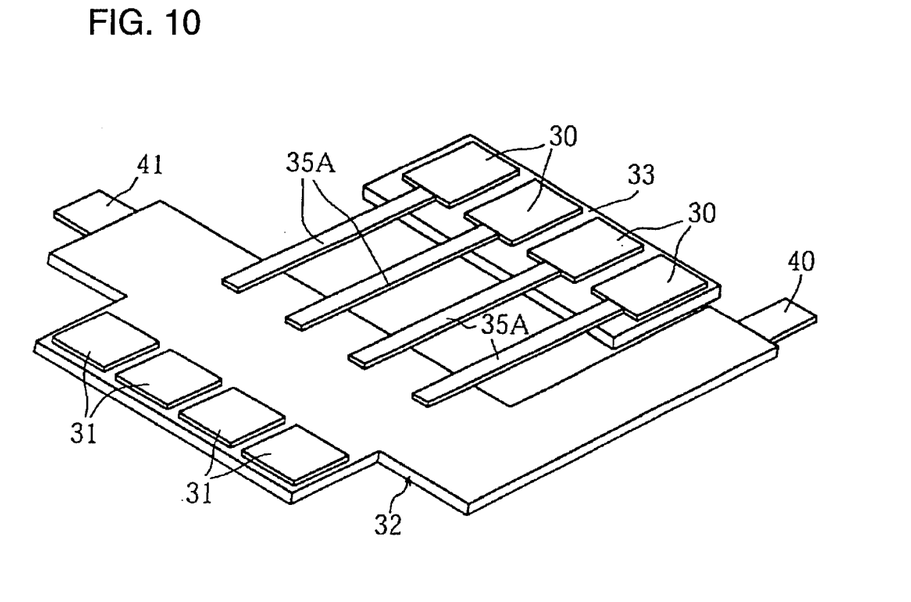
FIG. 10 is a perspective view showing another modification of the protective circuit device.

Further, second island 34 may be eliminated. Namely, as shown in FIG. 10, protective circuit device 3 may have only first island 33.

Figure 11:
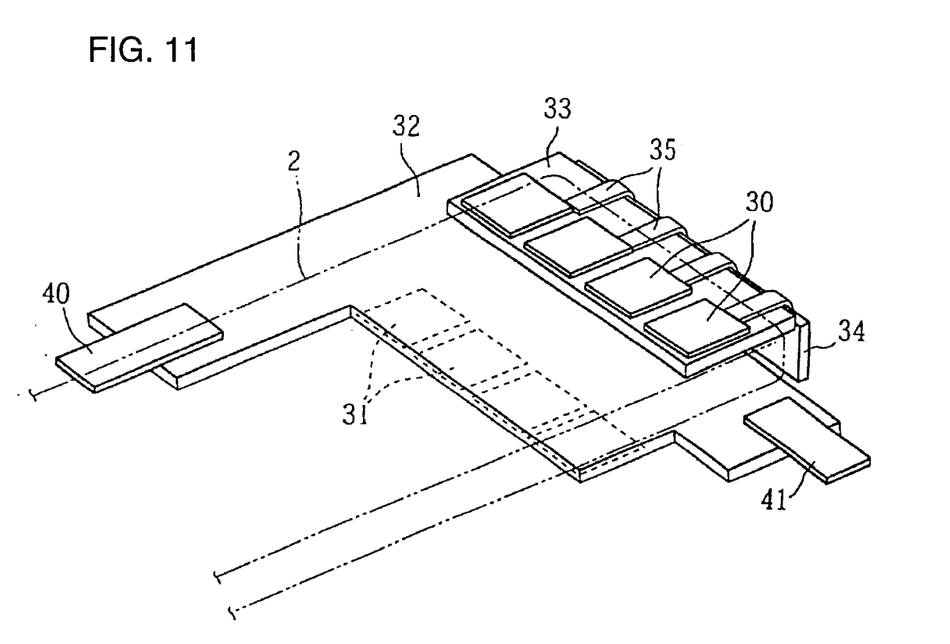
FIG. 11 is a perspective view showing another embodiment of the protective circuit device according to the present invention.

Then another embodiment of the present invention will be described with reference to FIG. 11. It is noted that the same members or components are denoted by the same reference numerals as in the aforementioned embodiment, and therefore description thereof will not be repeated.

The structure of protective circuit device 3 of the present embodiment is basically the same as that of protective circuit device 3 of the above described embodiment. Protective circuit device 3 is different from that of the above described embodiment in first island 33 and second island 34. In other words, in the above described embodiment, first and second islands 33 and 34 are formed continuously from one side of circuit board body 32 in the width direction (direction in which narrow portion 32B protrudes). However, in the present embodiment, first and second island 33 and 34 are formed continuously from the other side of circuit board body 32 in the width direction.

In the structure, an opening is formed on one side of circuit board body 32 in the width direction by first and second islands 33 and 34. Thus, if electronic parts 6 and the like are not mounted on the bottom side of first island 33 and directly below first island 33, the end of storage battery 2 can be enclosed in the space. Consequently, a storage battery pack with the above described protective circuit device 3 can be reduced in dimension in a longitudinal direction.

Although the present invention has been described, it is clearly understood that the same is by way of illustration and example only in all respects and is not to be taken by way of limitation. The scope of the present invention is limited by the terms of the appended claims, which includes meanings equivalent to the scope of the claims and all alterations in the scope.

INDUSTRIAL APPLICABILITY

The present invention is effectively applied to a protective circuit for a storage batter and a storage battery provided with the same.

What is claimed is:

1. A protective circuit device for a storage battery for preventing overcharge to a storage battery comprising:

a first board having a circuit portion;

a second board connected to said first board through a plurality of conductive plate-like metal pieces, wherein said plurality of conductive plate-like metal pieces are bent and said second board is spaced apart from said first board in a position opposite to said first board and said first board and said second board are connected by said plurality of conductive plate-like metal pieces so as to form a space between said first board and said second board on a connected side of the same; and a third board arranged between said second board and said first board, wherein said first board and said second board are connected through said third board and said plurality of conductive plate-like metal pieces to form spaces between said third board and said first and second boards.

2. The protective circuit device for a storage battery according to claim 1, wherein said first board has a first external terminal electrically connected to said circuit portion; and said second board has a second external terminal electrically connected to said circuit portion.

3. The protective circuit device for a storage battery according to claim 1, wherein said first board has a protrusion, said first external terminal is formed on said protrusion, and said second board is connected to an end of said first board positioned on a side opposite to that of said protrusion.

4. The protective circuit device for a storage battery according to claim 1, wherein said third board is vertically arranged with respect to said first board, and an interconnection pattern to be electrically connected to said circuit portion is formed on a surface of said third board.

5. The protective circuit for a storage battery according to claim 1, wherein an electronic part without a coating for increasing moisture resistance is mounted on said second board; and an electronic part with said coating is mounted on said first board.

6. The storage battery pack provided with a storage battery, a protective circuit device electrically connected to said storage battery to prevent overcharge to said storage battery, and an insulation casing enclosing said storage battery and said protective circuit device, said protective circuit device including first board having a circuit portion and a second board connected to said first board through a plurality of conductive plate-like metal pieces and a third board, wherein said plurality of conductive plate-like metal pieces are bent, said second board is spaced apart from said first board in a position opposite to said first board, said first board has a first external terminal electrically connected to said circuit portion, said second board has a second external terminal electrically connected to said circuit portion, said first and second external terminals are exposed from a surface of said insulation casing, said first board and said second board are connected by said plurality of conductive plate-like metal pieces so as to form a space between said first board and said second board on a connected side of the same, and said third board is provided between said first board and said second board, and said first board and said second board are connected through said third board and said plurality of conductive plate-like metal pieces to form spaces between said third board and said first and second boards.

* * * * *